(12) United States Patent
Haines et al.

(10) Patent No.: US 8,009,471 B2
(45) Date of Patent: Aug. 30, 2011

(54) LOW-WEAR WRITING IN A SOLID STATE MEMORY DEVICE

(75) Inventors: Jonathan W. Haines, Boulder, CO (US); Tong Shirh Stone, Eden Prairie, MN (US); Brett Alan Cook, Longmont, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 70 days.

(21) Appl. No.: 12/638,830

(22) Filed: Dec. 15, 2009

(65) Prior Publication Data

US 2011/0141833 A1 Jun. 16, 2011

(51) Int. Cl.
*G11C 16/04* (2006.01)
(52) U.S. Cl. ......... 365/185.03; 365/185.17; 365/185.14; 365/185.05; 365/189.06
(58) Field of Classification Search ............. 365/185.03, 365/185.17, 185.14, 185.05, 189.16
See application file for complete search history.

(56) References Cited

U.S. PATENT DOCUMENTS

| | | | |
|---|---|---|---|
| 7,333,364 B2 | 2/2008 | Yu et al. | |
| 7,548,457 B2 | 6/2009 | Kang et al. | |
| 2008/0192544 A1* | 8/2008 | Berman et al. | 365/185.09 |
| 2008/0232165 A1 | 9/2008 | Abraham | |
| 2009/0003055 A1 | 1/2009 | Hwang | |
| 2009/0031074 A1 | 1/2009 | Son | |
| 2009/0037652 A1 | 2/2009 | Yu et al. | |
| 2009/0154238 A1 | 6/2009 | Lee | |

* cited by examiner

*Primary Examiner* — Thong Q Le
(74) *Attorney, Agent, or Firm* — Hollingsworth & Funk, LLC

(57) ABSTRACT

A method includes programming a non-volatile memory. The memory includes a plurality of cells, wherein each cell is configured to store a plurality of values, wherein each of value is represented by N digits where N is an integer greater than 1, wherein each of the plurality of cells is further configured to store electric charge representing a plurality of voltage levels, and wherein each of the plurality of voltage levels represents one of the plurality of values. Programming comprises providing the plurality of voltage levels into a first group of voltage levels and a second group of voltage levels in one of the plurality of cells, wherein a highest voltage level of the first group is less than or substantially equal to a lowest voltage level of the second group, and storing, in the first group of voltage levels, electric charge representing a value comprising, at most, N-1 digits.

30 Claims, 13 Drawing Sheets

LOW-WEAR WRITING IN A SOLID STATE MEMORY DEVICE

BACKGROUND

Computers and other electronic devices generally require a medium in which digital data can be stored and retrieved. Data storage devices come in a variety of forms and serve a variety of purposes. These devices can be broken down into two general categories: solid state and non-solid state storage devices.

Non-solid state devices are devices that contain moving parts. Some typical non-solid state storage devices are hard disk drives, CD/RW drives and disks, DVD/R/RW drives and disks, floppy disks, tape drives and probe memory devices. These storage devices move one or more media surfaces and/or the associated data head relative to one another to position the data head relative to a desired location or area on the media. The data is then written to or read from this data location. In disk drives for example, data is stored on a disk that rotates at an essentially constant velocity. By moving the head over the rotating disk, all memory locations or sectors of the disk can be accessed.

Solid state storage devices differ from non-solid state devices in that they typically have no moving parts. Solid state storage devices may be used for primary storage of data for a computing device, such as a personal computer, workstation computer, or server computer. An example of a solid state storage device is flash memory.

Flash memory, e.g., NAND flash memory, is comprised of a number of cells, with each cell being similar to a metal-oxide semiconductor (MOS) field-effect transistor (FET) and having a gate, a drain, and a source. In addition, the cell includes a "floating gate." When a voltage is applied between the gate and the source, the voltage difference between the gate and the source creates an electric field, thereby allowing electrons to flow between the drain and the source in the conductive channel created by the electric field. When strong enough, the electric field may force electrons flowing in the channel onto the floating gate via Fowler-Nordheim quantum tunneling. The number of electrons on the floating gate determines a threshold voltage level of the cell.

Flash memory may be broken into two categories: single-level cell (SLC) and multi-level cell (MLC). In SLC flash memory, two voltage levels are used for each cell, thus allowing SLC flash memory to store one bit of information per cell. In MLC flash memory, more than two voltage levels are used for each cell, thus allowing MLC flash memory to store more than one bit per cell.

Flash memory suffers from wear more than non-solid state devices. That is, charges may be applied and removed, e.g., the cell may be written and erased, a finite number of times before the structure of the cell is physically compromised. Although MLC flash memory is capable of storing more bits than SLC flash memory, MLC flash memory suffers from more wear than SLC flash memory.

SUMMARY

In one example, the disclosure is directed to a method comprising programming a non-volatile memory. The memory includes a plurality of cells, wherein each of the plurality of cells is configured to store a plurality of values, wherein each of the plurality of values is represented by N digits where N is an integer greater than 1, wherein each of the plurality of cells is further configured to store electric charge representing a plurality of voltage levels, and wherein each of the plurality of voltage levels represents one of the plurality of values. Programming comprises providing the plurality of voltage levels into a first group of voltage levels and a second group of voltage levels in one of the plurality of cells, wherein a highest voltage level of the first group is less than or substantially equal to a lowest voltage level of the second group, and storing, in the first group of voltage levels, electric charge representing a value comprising, at most, N-1 digits.

In another example, the disclosure is directed to a system comprising a non-volatile memory, wherein the memory includes a plurality of cells, wherein each of the plurality of cells is configured to a plurality of values, wherein each of the plurality of values is represented by N digits where N is an integer greater than 1, wherein each of the plurality of cells is further configured to store electric charge representing a plurality of voltage levels, wherein each of the plurality of voltage levels represents one of the plurality of values. The system further comprises at least one controller configured to provide the plurality of voltage levels into a first group of voltage levels and a second group of voltage levels in one of the plurality of cells, wherein a highest voltage level of the first group is less than or substantially equal to a lowest voltage level of the second group, and store, in the first group of voltage levels, electric charge representing a value comprising, at most, N-1 digits.

In another example, the disclosure is directed to a computer-readable medium comprising instructions encoded on the computer-readable medium that, upon execution, cause a controller within a device to program a non-volatile memory, wherein the memory includes a plurality of cells, wherein each of the plurality of cells is configured to store a plurality of values, wherein each of the plurality of values is represented by N digits where N is an integer greater than 1, wherein each of the plurality of cells is further configured to store electric charge representing a plurality of voltage levels. Programming the non-volatile memory comprises providing the plurality of voltage levels into a first group of voltage levels and a second group of voltage levels in one of the plurality of cells, wherein a highest voltage level of the first group is less than or substantially equal to a lowest voltage level of the second group, and storing, in the first group of voltage levels, electric charge representing a value comprising, at most, N-1 digits.

In another example, the disclosure is directed to a method of programming a non-volatile memory comprising a plurality of cells. The method comprises determining a first set of L cells of the plurality of cells, wherein each cell of the first set is configured to store electric charge representing $2^M$ voltage levels, wherein L and M are integers, wherein each of the plurality of voltage levels represents one of $2^M$ values, and wherein each of the $2^M$ values is represented by M digits. The method further comprises determining, based on L, M, and X, a second set of K cells of the plurality of cells, wherein K and X are integers and wherein K is not equal to L, wherein X represents a plurality of voltage levels in each cell of the second set of K cells. The method further comprises storing electric charge representing one of the X voltage levels in at least one cell of the second set of K cells, wherein the one of the X voltage levels represents a value comprising P digits, and wherein P is an integer or non-integer and not equal to M.

In another example, the disclosure is directed to a system comprising a non-volatile memory comprising a plurality of cells, and at least one controller. The at least one controller is configured to determine a first set of L cells of the plurality of cells, wherein each cell of the first set is configured to store electric charge representing $2^M$ voltage levels, wherein L and M are integers, wherein each of the plurality of voltage levels represents one of $2^M$ values, and wherein each of the $2^M$ values is represented by M digits. The at least one controller is further configured to determine, based on L, M, and X, a second set of K cells of the plurality of cells, wherein K and X are integers and wherein K is not equal to L, wherein X represents a plurality of voltage levels in each cell of the second set of K cells. The at least one controller is further configured to store electric charge representing one of the X voltage levels in at least one cell of the second set of K cells, wherein the one of the X voltage levels represents a value comprising P digits, wherein P is an integer or non-integer and not equal to M.

In another example, the disclosure is directed to a computer-readable medium comprising instructions encoded on the computer-readable medium that, upon execution, cause a controller within a device to determine a first set of L cells of a plurality of cells of a non-volatile memory, wherein each cell of the first set is configured to store electric charge representing $2^M$ voltage levels, wherein L and M are integers, wherein each of the plurality of voltage levels represents one of $2^M$ values, and wherein each of the $2^M$ values is represented by M digits, determine, based on L, M, and X, a second set of K cells of the plurality of cells, wherein K and X are integers and wherein K is not equal to L, wherein X represents a plurality of voltage levels in each cell of the second set of K cells, and store electric charge representing one of the X voltage levels in at least one cell of the second set of K cells, wherein the one of the X voltage levels represents a value comprising P digits, and wherein P is an integer or non-integer and not equal to M.

These and various other features and advantages will be apparent from a reading of the following detailed description.

DETAILED DESCRIPTION

In general, this disclosure describes techniques for partitioning the voltage levels in multiple level memory cells. In certain examples, such partitioning may be used for reducing wear in a solid state drive (SSD). In MLC flash memory ("MLC flash"), more than three voltage levels are needed in order to represent two or more bits of information per cell, and more than two voltage levels are needed in order to represent more than one bit of information per cell. That is, in MLC flash, in order to store a number N bits per cell, where N is an integer, there must be at least $2^N$ distinguishable voltage levels available per cell. For example, in order to store three bits in a cell, e.g., "111," "110," "101," "100," "011," "010," "001," or "000," the MLC flash must have at least $2^3$, or eight, voltage levels available per cell, with each voltage level representing one of the combinations of the three bits. Without wishing to be bound by any theory, it has been observed that as the maximum voltage required to encode these levels increases, the amount of wear, e.g., damage, to a cell increases, often in a non-linear fashion. In other words, higher voltage levels can cause more wear, e.g., damage, to the cells than lower voltage levels. Using the techniques of this disclosure, wear may be reduced in non-volatile memory, e.g., MLC flash, by reducing the use of the highest voltage levels of a cell for storing data. By reducing the wear in non-volatile memory, the lifespan of the non-volatile memory, and thus the SSD, may be increased.

Figure 1:
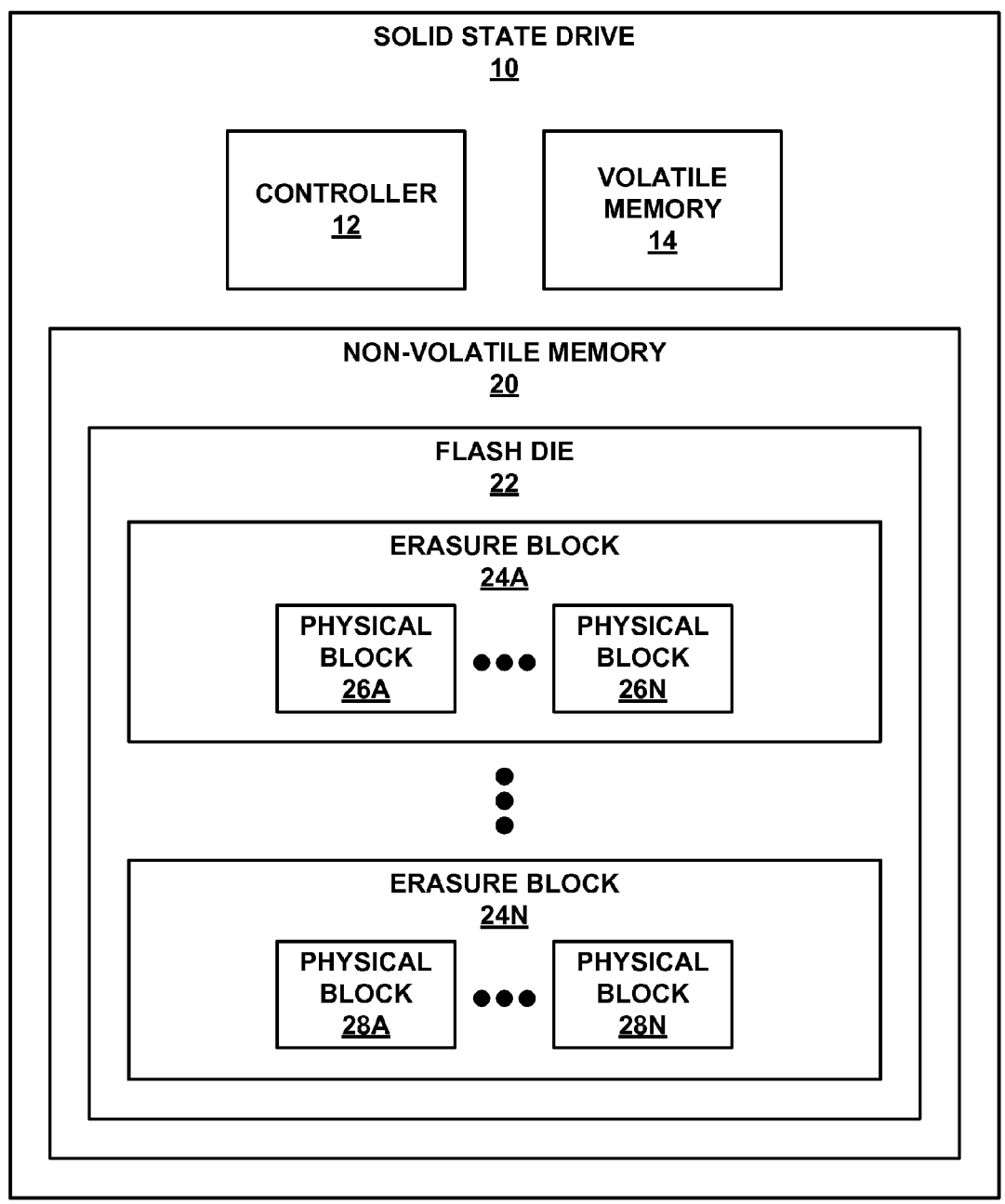
FIG. 1 is a block diagram illustrating an example solid state drive (SSD).

FIG. 1 is a block diagram illustrating an example solid state drive (SSD) 10. In the example of FIG. 1, SSD 10 includes controller 12, volatile memory 14, and non-volatile memory 20. Volatile memory 14 may correspond to random access memory (RAM). Non-volatile memory 20 corresponds to long-term storage of SSD 10. In general, SSD 10 includes one or more flash dies, such as flash die 22, each of which include a plurality of erasure blocks 24A-24N ("erasure blocks 24"). Flash die 22 may generally be one of a number of dies included within a semiconductor chip, and an SSD 10 may comprise one or more semiconductor chips. Each of erasure blocks 24 includes a plurality of physical blocks. In the example of FIG. 1, erasure block 24A includes physical blocks 26A-26N ("physical blocks 26") and erasure block 24N includes physical blocks 28A-28N ("physical blocks 28"). It should be understood that the letter N in the reference numerals above is a non-negative integer and that the use of N with respect to different reference numbers should not be understood as implying that the number of items are equal. For example, the number of physical blocks 26 is not necessarily equal to the number of physical blocks 28. Likewise, the number of erasure blocks 24 is not necessarily equal to the number of physical blocks 26 or the number of physical blocks 28.

In the example of FIG. 1, SSD 10 includes controller 12. Controller 12 comprises hardware, such as one or more processors, microprocessors, digital signal processor (DSPs), application specific integrated circuits (ASICs), field programmable gate arrays (FPGAs), or any other equivalent integrated or discrete logic circuitry for performing the functions ascribed to controller 12. In other examples, a computing device (not shown) coupled to SSD 10 may implement the functionality ascribed to controller 12. For example, an SSD may not include controller 12, and instead a software driver implemented by an operating system of the computing device may perform the functions of controller 12. In this manner, a processor or other control unit separate from SSD 10 may control SSD 10.

In general, SSD 10 stores data for a long-term period in a physical block, such as physical block 26A of erasure block 24A. Data is stored using logical block address (LBA) blocks, also referred to simply as LBAs. Controller 12 also writes data regarding each physical block to a header in the physical block. The header generally includes metadata that describes data of the corresponding physical block. The header may include data such as a number of LBAs stored in the corresponding physical block and a size or length of the header.

Before writing data to a physical block, such as physical block 26A, controller 12 writes the data to volatile memory 14. Controller 12 accumulates a full physical block of data in volatile memory 14 before writing the physical block to non-volatile memory 20, e.g., in physical block 26A. As controller 12 receives LBAs to be stored from a host (e.g., a computing device coupled to SSD 10), controller 12 writes the received LBAs to volatile memory 14. In some examples, controller 12 also compresses the data in volatile memory 14.

Compressing data results in effective over-provisioning. In general, over-provisioning refers to the difference between the amount of data made available to the host (or a user thereof) and the actual amount of data that can be stored on SSD 10. That is, SSD 10 may, in some examples, be capable of storing a greater amount of data than advertised to a user and/or user's host. SSD 10 may advertise the capability to store N bytes of data to the host, but in actuality may be capable of storing M bytes of data where M>N. When SSD 10 can store more than N bytes of data, SSD 10 is said to be over-provisioned. The value N represents an advertised amount of total storage in SSD 10. SSD 10 may use compression techniques, additional physical memory, or a combination thereof to provide over-provisioning. For example, if (N=M) and controller 12 can compress data by a ratio of 2:1, then ½ N is not necessary to store data.

There are several advantages that stem from using over-provisioning in an SSD. For example, SSD 10 may operate faster if there is over-provisioning because when controller 12 is searching for an available physical block to write new data, there tend to be more physical blocks, e.g., pages, with less valid data that must be rewritten elsewhere at the time controller 12 is searching. With sufficient over-provisioning, controller 12 avoids needing to copy data internally in order to get an erasure block fully available for writing. It should be noted that an erasure block must be completely erased in order for any physical block in the erasure block to be written to. The copying of data internally to free up entire erasure blocks for writing is referred to as "garbage collection." If garbage collection is using fewer resources, then more back-end flash resource space may be available for host data to be written to, thereby potentially increasing performance.

Another advantage of over-provisioning is reduction in wear to the non-volatile memory, e.g., MLC flash. Copying data internally via garbage collection techniques causes additional wear to the flash. The wear caused by garbage collection is not the result of the host providing data that needs to be written, but rather the internal data-copying techniques necessary for effective data storage in non-volatile memory 20.

For example, assume that data may be randomly written to erasure blocks in the non-volatile memory, a mapping strategy allows any LBA to be put in any portion of the non-volatile memory, and a table keeps track of the location of the LBAs in physical space. As erasure blocks 24 are re-written, holes are "created" because erasure blocks 24 have some LBAs that are no longer valid, but the erasure blocks still have some valid data. Until the entire erasure block is erased, no data may be written to the erasure block. Garbage collection techniques copy all the valid data from a first erasure block to a second erasure block, e.g., a partially filled erasure block, thereby freeing up the first erasure block to be erased. By providing over-provisioning, the need for garbage collection is reduced because, with random writes, it is more likely an erasure block will be available for new data to be written to with less data needing to be copied out of it before erasure to make it available once again for writing. As such, over-provisioning provides a wear-benefit.

Furthermore, in accordance with this disclosure and as will be described in more detail below, higher voltage states of MLC flash can generally be avoided, thereby resulting in less wear to the non-volatile memory. Although avoiding the higher voltage states reduces over-provisioning and its associated wear-benefit, overall wear to the device may be reduced because the higher voltage states may cause more wear than the lower voltage states.

Figure 2:
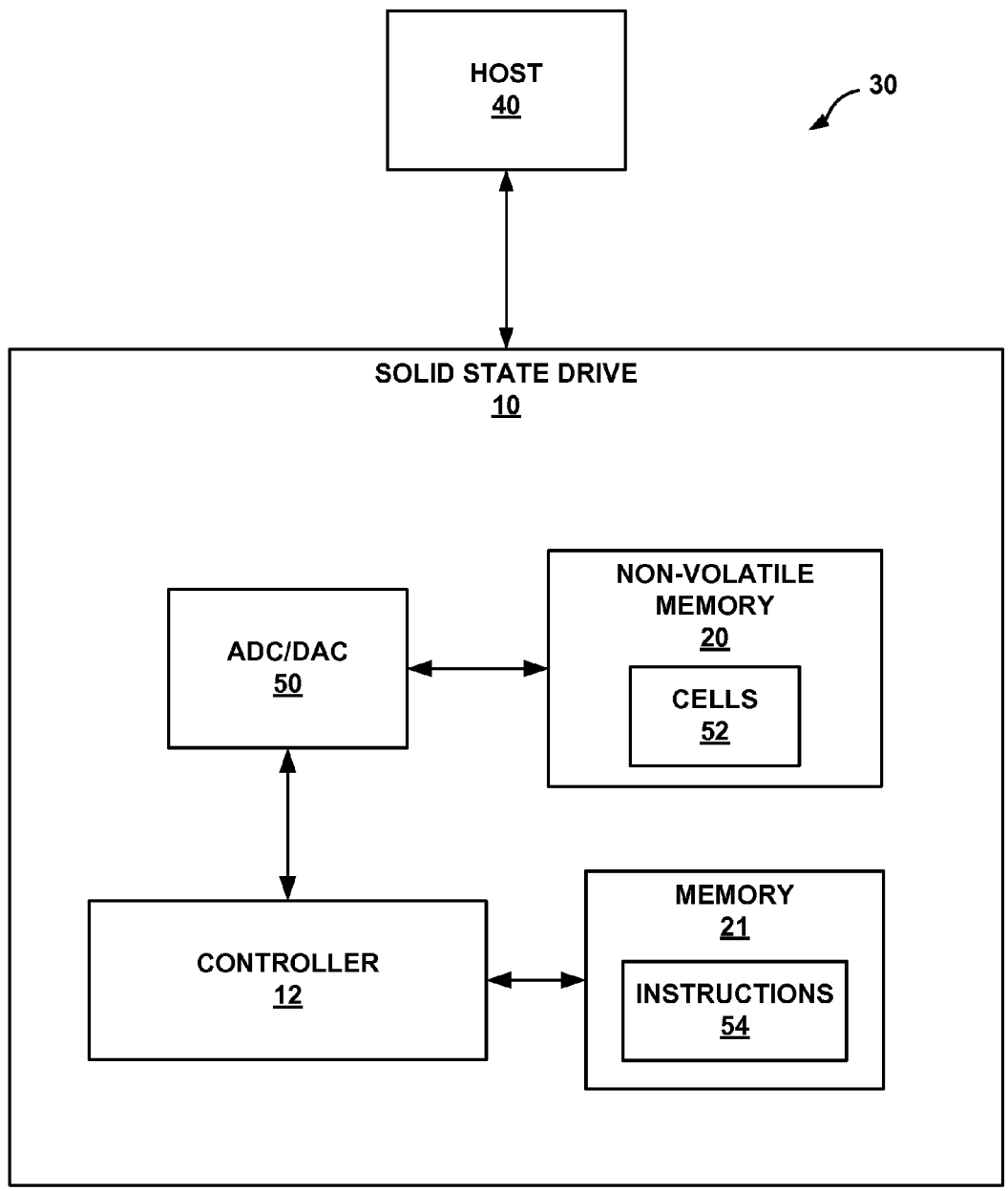
FIG. 2 is a block diagram illustrating an example system including the SSD of FIG. 1.

FIG. 2 is a block diagram illustrating an example system including the SSD of FIG. 1. In FIG. 2, a system 30 is shown including a host 40 and solid state drive 10. Host 40 may comprise a wide variety of devices, such as one or more of a personal digital assistant (PDA), a workstation, a personal computer, a laptop computer, a mobile telephone, a media player, or any other device capable of transmitting data to or receiving data from a storage media. Host 40 may communicate with solid state drive 10 via a host interface (not depicted). Solid state drive 10 further includes controller 12, non-volatile memory 20, e.g., NAND flash memory, memory 21, and analog-to-digital converter (ADC)/digital-to-analog converter (DAC) 50. Non-volatile memory 20 is comprised of a plurality of cells 52 with each cell 52 configured to store electric charge corresponding to a value comprising a number N bits with N being an integer greater than 1. Each of cells 52 is further configured to store electric charge representing one of $X^N$ voltage levels, the voltage level representing the binary value, where X is an integer.

Controller 12 may be configured to perform a number of tasks, including executing instructions 54 stored in memory 21 that allow controller 12 to read data from and write data to non-volatile memory 20, via ADC/DAC 50. Controller 12 comprises hardware, such as one or more processors, microprocessors, digital signal processor (DSPs), application specific integrated circuits (ASICs), field programmable gate arrays (FPGAs), or any other equivalent integrated or discrete logic circuitry for performing the functions ascribed to controller 12.

For example, when host 40 transmits digital signals comprising information to be stored in solid state memory 10 and, in particular, in cells 52 of non-volatile memory 20, controller 12 executes instructions that cause ADC/DAC 50 to convert the digital signal to analog signals, e.g., voltage levels. ADC/DAC 50 may have a resolution that is greater than, e.g., a greater number of quantization levels, a resolution of the particular cells (e.g., a number of possible bit values that can be represented by the particular cells) of the data flash. For example, if non-volatile memory 20 is a 3-bit MLC flash, the ADC/DAC 50 may have more than $2^3$, or eight, quantized levels, to represent one of the three-bit combinations, e.g., codewords, of "111," "110," "101," "100," "011," "010," "001," or "000." ADC/DAC 50 converts each three-bit combination to a quantized voltage level. Controller 12 then executes instructions that apply the quantized voltage level to one of cells 52, thereby storing electric charges representing one three-bit combination. In particular, controller 12 causes electric charges representing the bit combination to be stored on the floating gate of a cell of non-volatile memory 20.

Similarly, when host 40 transmits a request for information previously stored in solid state drive 10 and, in particular, in cells 52 of non-volatile memory 20, controller 12 executes instructions that cause ADC/DAC 50 to convert the particular voltage level representing the bit combination stored on the floating gate of a cell of non-volatile memory 20 to a digital signal. ADC/DAC 50 quantizes an estimate of the amount of charge on the floating gate of the cell to a particular voltage level that represents a bit combination. Controller 12 then executes instructions that transmit the bit combination to host 40. In this manner, host 40 may read data from and write data to solid state device 10.

Figure 3:
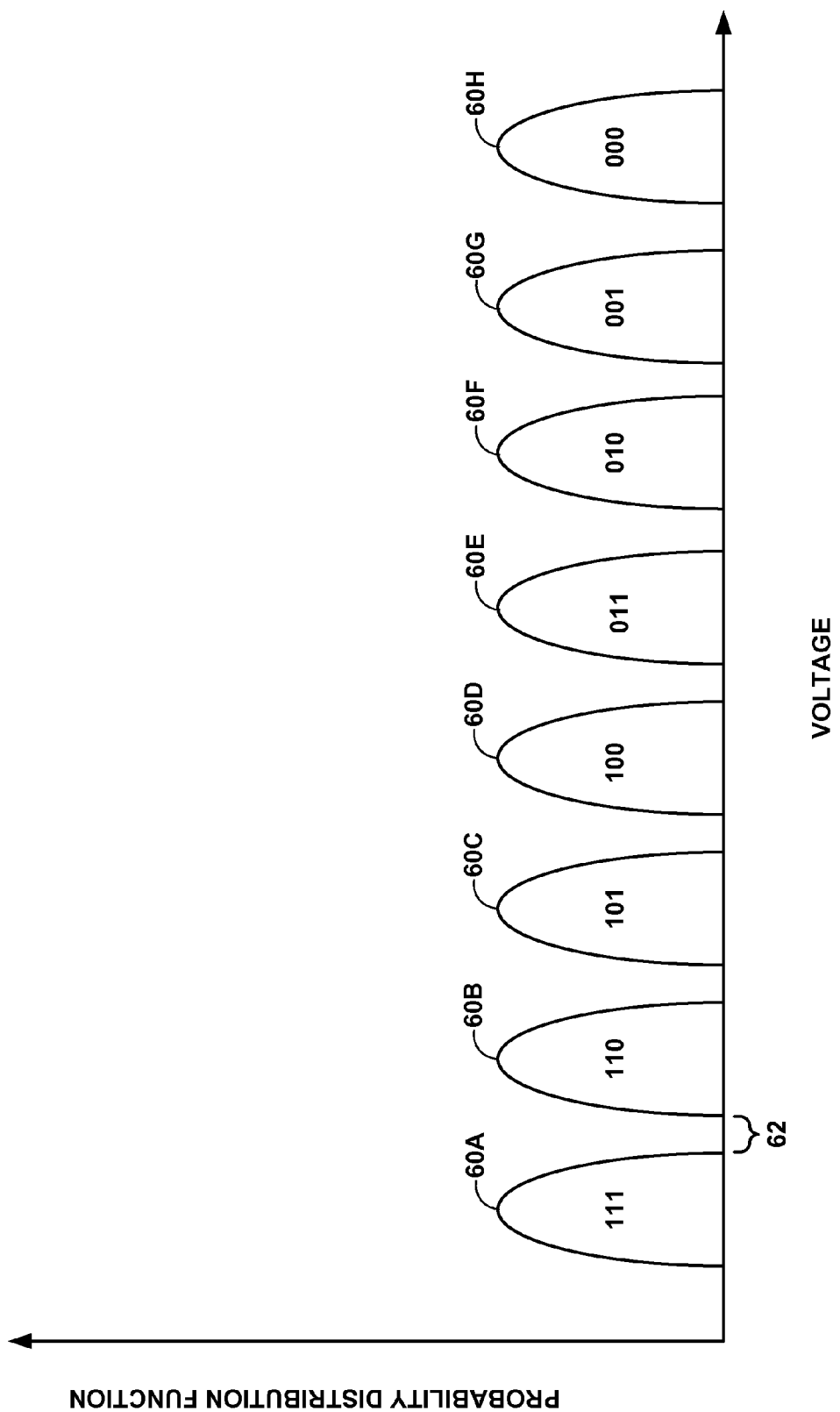
FIG. 3 is a graph illustrating example voltage levels in an MLC flash cell and the three-bit combinations associated with each voltage level.

FIG. 3 is a graph illustrating example voltage levels in an MLC flash cell and the three-bit combinations associated with each voltage level. In FIG. 3, the x-axis represents the voltage level associated with the charge stored on the floating gate of a cell. FIG. 3 depicts eight voltage levels 60A-60H ("voltage level 60") and exemplary three-bit combinations of values that each voltage level may represent. It should be noted that although MLC flash cells may be capable of storing more than three bits, for ease of illustration purposes, only three bits, and the corresponding $2^3$, or eight, voltage levels required to represent the three bits are depicted. In general, each of the plurality of cells is configured to store a plurality of values. Each of the plurality of values is represented by N digits where N is an integer greater than 1. Each of the plurality of cells is further configured to store electric charge representing a plurality of voltage levels, with each of the plurality of voltage levels representing one of the plurality of values. The y-axis in FIG. 3 represents a probability distribution function, illustrating the likelihood that a particular voltage level represents a particular three-bit combination, if each three-bit combination were written with equal probability.

As seen in FIG. 3, each of voltage levels 60 is separated from adjacent voltage levels 60 by voltage gap 62. Increasing voltage gap 62 improves signal-to-ratio, thereby increasing the likelihood that a particular voltage level represents a particular three-bit combination. For example, as voltage gap 62 increases between voltage levels 60A and 60B, the more likely ADC/DAC 50 will be able to accurately quantize the voltage level of the cell as either voltage level 60A or voltage level 60B. Accurate quantization of the voltage level allows ADC/DAC 50 and controller 12 to more accurately determine the intended bit combination, e.g., a "111" or a "110," thus resulting in fewer errors. Increasing voltage gap 62 may, however, reduce the number of voltage levels available, and thus the number of bit combinations that may be stored per cell.

Decreasing voltage gap 62 may allow more bit combinations to be stored per cell. However, as the voltage gap 62 is decreased, charges must be more accurately placed on and read from the floating gate of each cell via controller 12 and ADC/DAC 50.

Figure 4:
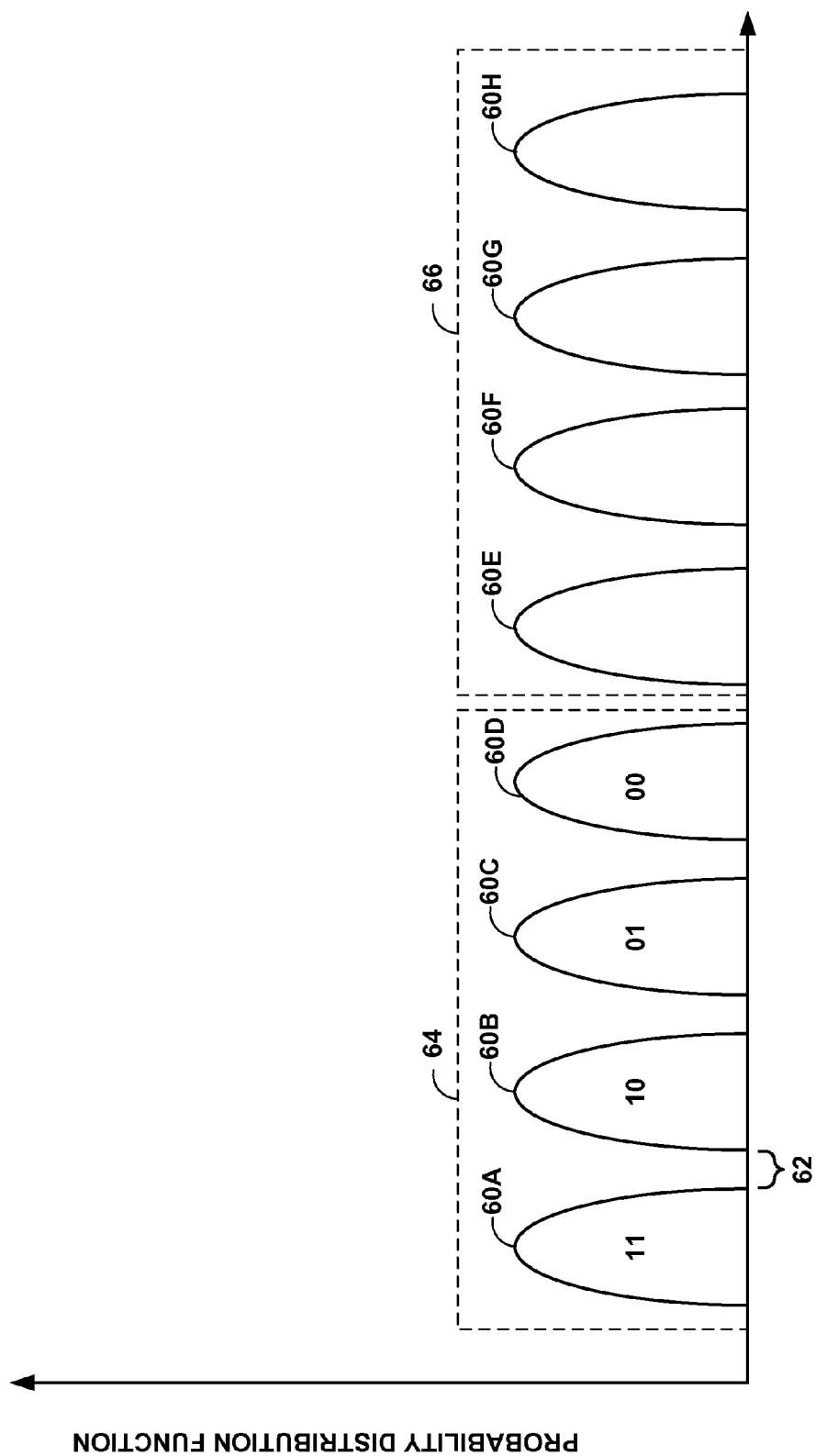
FIG. 4 is a graph illustrating example voltage levels in an MLC flash cell and the bit combinations associated with each voltage level, in accordance with the techniques of this disclosure.

FIG. 4 is a graph illustrating example voltage levels in an MLC flash cell and the bit combinations associated with each voltage level, in accordance with the techniques of this disclosure. Like FIG. 3, FIG. 4 depicts eight voltage levels. Indeed, the MLC flash cell in FIG. 4 may be the same MLC flash cell of FIG. 3. Voltage levels 60 of FIG. 4 are divided into two groups, lower voltage level group 64 and higher voltage level group 66. In FIG. 4, the two groups are evenly divided, with voltage levels 60A-60D in first group 64 and voltage levels 60E-60H in second group 66. Although the two groups are evenly divided in FIG. 4, in some examples, there may be more voltage levels in first group 64 then second group 66, or more voltage levels in second group 66 then first group 64.

Using the techniques of this disclosure, wear may be reduced in non-volatile memory 20 by using the voltage levels in first group 64 and avoiding the higher voltage levels in second group 66, when possible. As seen in FIG. 4, if the voltage levels in second group 66, e.g., the higher voltage levels, are avoided, only the four voltage levels in first group 64 are available for programming purposes. With only four voltage levels available, namely voltage levels 60A-60D, only two-bit combinations, e.g., "11," "10," "01," and "00," may be stored in the cell. Or, to generalize, if the cell is capable of storing a plurality of values, with each of the plurality of values represented by up to N digits with N being an integer greater than 1, electric charge representing a value comprising, at most, N-1 digits is stored. However, as long as the SSD does not need the storage, e.g., channel capacity, that the highest voltage levels in second group 66 offer, wear of the non-volatile memory, e.g., NAND flash, may be reduced. Thus, data may be "spread out" in the non-volatile memory in a manner other than what would otherwise be allowed using simply over-provisioning and mapping techniques.

Referring again to FIG. 2, controller 12 provides the plurality of voltage levels of non-volatile memory 20, e.g., the eight voltage levels of FIG. 2, into first group 64 of voltage levels and second group of voltage levels 66. For instance, if non-volatile memory 20 has eight voltage levels, controller 12 executes instructions that divide the eight levels into two groups, e.g., as shown in FIG. 4, where the voltage levels in the first group are lower in value than the voltage levels in the second group. In this manner, controller 12 has effectively reconfigured non-volatile memory 20 to store one less digit of data per cell than it would otherwise be capable of storing. For example, eight voltage levels allow a cell to store three digits, e.g., bits, of data, but reducing the allowable voltage levels to four reduces the amount of digits that can be stored to two.

When host 40 attempts to write digital data to solid state drive 10, the data is transmitted via a host interface, for example, to controller 12. For simplicity, other components of solid state drive 10 have been omitted, such as a buffer manager, formatter, and a read/write channel decoder. Upon receiving the digital data, controller 12 prepares the data for storage by dividing the data into digit combinations that are compatible with non-volatile memory 20. Continuing the example from above, controller 12 may prepare the digital data into two-bit combinations for storage, given that controller 12 has effectively reconfigured non-volatile memory 20 to store only two bit combinations by reducing the number of voltage levels from eight to four. Controller 12 determines the cell to be written to and provides ADC/DAC 50 with appropriate word and bit lines that form the address of the cell. Controller 12 then instructs ADC/DAC 50 to assert a voltage onto the cell to be written to. In conjunction with on-chip charge pumps or an external supply, the assertion of a voltage onto the cell by ADC/DAC 50 forces charge from the channel onto the floating gate of the cell. In this manner, controller 12 stores, in the first group of N voltage levels 64, electric charge representing a value comprising, at most, N-1 digits. It should be noted that although the above example used binary digits, or bits, the techniques of this disclosure may be applicable to other configurations, including, but not limited to, base 3, base 4, and base 5 configurations.

When host 40 attempts to read digital data from solid state drive 10, controller 12 instructs ADC/DAC 50 to determine the voltage on the cell to be read from. ADC/DAC 50 determines the voltage level on the cell and controller 12 determines via a table of threshold values, for example, the bit combination that is associated with that particular voltage level. Controller 12 then transmits the bit combination to host 40.

The techniques described above generally avoid the higher voltage states, e.g., second group 66, thereby resulting in less wear to the non-volatile memory. These techniques are based on two assumptions: writing, not erasure, causes most of the wear to the device; and "reprogramming," e.g., re-writing cells to different voltages, even if monotonically programmed, may not be desirable.

However, if erasure, rather than writing and reprogramming, is assumed to cause the majority of the wear to the non-volatile memory, it may be desirable in some instances to use the higher voltage states for programming. In accordance with this disclosure, programming may be accomplished that monotonically increases voltage such that each of eight voltage levels, for example, may first be programmed with one of four lower voltage levels, e.g., 60A-60D, and then, without erasing the erasure block, a cell may be reprogrammed with one of voltage levels 60D-60G or 60E-60H, for example, in a "reuse" of the erasure block. Reuse may be generally defined as reprogramming a cell without first erasing the erasure block. It should be noted that reprogramming with voltage levels 60D-60G rather than voltage levels 60E-60H avoids level 60H, which may be the voltage level that causes the most wear of any of the eight voltage levels available.

Figure 5:
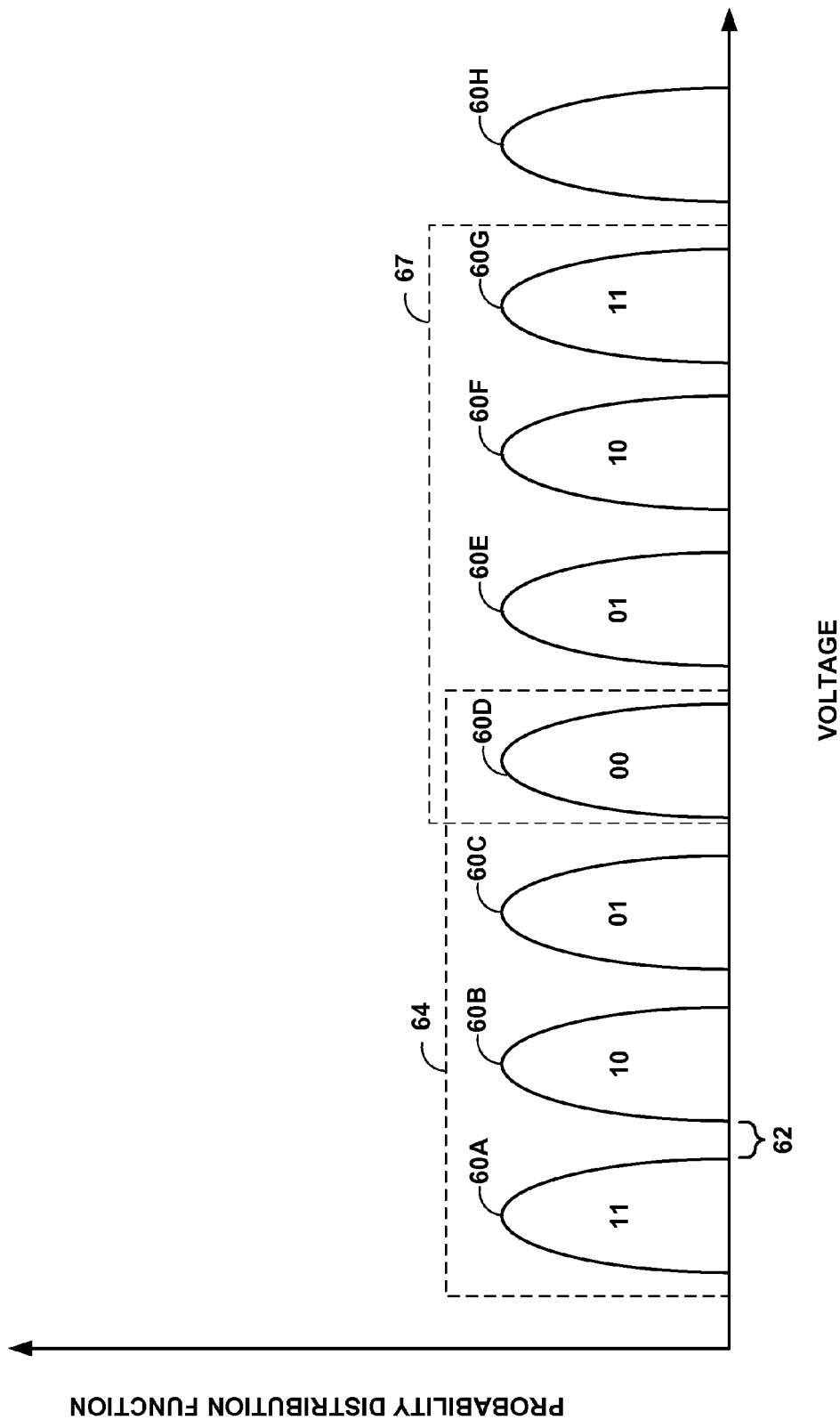
FIG. 5 is a graph illustrating example voltage levels in an MLC flash cell and the bit combinations associated with each voltage level when a cell is reused, in accordance with the techniques of this disclosure.

FIG. 5 is a graph illustrating example voltage levels in an MLC flash cell and the bit combinations associated with each voltage level when a cell is reused, e.g., reprogrammed without an erase operation, in accordance with the techniques of this disclosure. FIG. 5 is similar to FIG. 4, depicting voltage levels 60A-60H divided into first group of voltage levels 64 and second group of voltage levels 67. In FIG. 5, however, voltage level 60D is common to both first group 64 and second group 67. That is, voltage level 60D, the highest voltage level in the first group, is substantially equal to voltage level 60D, the lowest level in the second group. With the exception of voltage level 60D, the voltage levels of second group 67 are higher than the voltage levels of first group 64.

As shown in FIG. 5, voltage levels in second group 67 are used to represent bit combinations, e.g., two-bit combinations. As described above with respect to FIG. 4, a first programming of a cell occurs begins when controller 12 instructs ADC/DAC 50 to assert a voltage onto the cell to be written to and, in conjunction with on-chip charge pumps, the assertion of a voltage onto the cell by ADC/DAC 50 forces charge from the channel onto the floating gate of the cell. In this manner, controller 12 stores, in the first group of N voltage levels 60, electric charge representing a value comprising, at most, N-1 digits.

Next, in one example in accordance with the disclosure, the cell may be reused, e.g., reprogrammed, without first erasing an entire erasure block. To be reused, one of the voltage levels in first group 64 must be changed to one of the voltage levels in second group 67. For example, referring again to FIG. 5, assume that a two-bit combination of "01" was first stored in the cell. To store a "01," sufficient charge must be placed on the floating gate of the cell to develop a voltage level of 60C, which in this case represents a "01." In accordance with this disclosure, the bit combination of "01" may be changed to a bit combination of "10," represented by the voltage level of 60F, for example, without first erasing the cell, e.g., the entire erasure block that includes the cell. In other words, the cell may be "reused." To reuse the cell, controller 12 instructs ADC/DAC 50 to read the current voltage on the floating gate of the cell. ADC/DAC 50 returns a value to controller 12. In some examples, controller 12 queries a look-up table to determine the bit pattern associated with the particular voltage level returned by the ADC/DAC 50. In the above example, the query to the look-up table would return the voltage level 60C. In response, controller 12 instructs ADC/DAC 50 to assert a voltage onto the cell and, in conjunction with on-chip charge pumps, the assertion of a voltage onto the cell by ADC/DAC 50 forces charge from the channel onto the floating gate of the cell sufficient to change the voltage level from 60C, which represents an "01" to voltage level 60F, which represents a "10" in the second group. In this manner, the cell stores, in the second group of voltage levels, electric charge representing a value comprising, at most, N-1 digits, without first erasing the cell.

As mentioned above, voltage level 60D, the highest voltage level in the first group, is substantially equal to voltage level 60D, the lowest level in the second group. By providing a voltage level such as 60D that is common to both first group 64 and second group 67, the highest voltage level, and thus the voltage level that induces the most wear, e.g., voltage level 60H in FIG. 5, may generally be avoided. Nevertheless, in some examples, it may be desirable to use voltage level 60H. For example, first group 64 and second group 67 of FIG. 5 may be arranged in the manner depicted in FIG. 4. In FIG. 4, there is no overlap between the first group and the second group. This particular example may account for any overprogramming issues that may be inherent to the non-volatile memory. Overprogramming may occur when, for example, a voltage level of 60D applied to a cell that already has sufficient charge on the floating gate to represent a voltage level of 60D results in a voltage level of 60E, rather than remaining at a level of 60D. Thus, in non-volatile memory that exhibit overprogramming, voltage levels must be monotonically increased. As such, in non-volatile memory that exhibit overprogramming, allowing the highest voltage level of the non-volatile memory, e.g., voltage level 60H, to be used to store charge representing bit combinations may allow a cell to be "reused," e.g., reprogrammed without first erasing the erasure block.

Through "reuse" of a cell, wear amplification may be dramatically reduced. For example, for small writing operations, reuse may result in a wear-halving effect because the effective physical blocks and effective erasure blocks are one-half as large, thereby reducing the wear amplification by 50%, while also effectively reducing the amount of flash capacity by 50%. If the SSD is successful at compressing data, or if not much of the host's capacity is written, this may be an advantageous use of overprovisioning. For example, assume an SSD is designed for a mostly non-compressible workload, and the SSD internally maps 4 Kibytes (KiB), 3-bit/cell flash pages as atomic objects but sees 4 KiB (aligned) random writes from the host that are 50% compressible, e.g., the resulting compressed data could fit into 2 KiB. Because the 50% compressible data leads to twice as much capacity as needed, each erasure block may be written with one-half sized pages (with one-half of the erasure block capacity), twice between erasures, thereby reducing the wear of the SSD. That is, if the 4 KiB flash pages were atomically written, then a 4 KiB host write would either need to waste half of a 4

KiB, 3-bit MLC page, or other data would need to be stored along with it, which may cause more wear when garbage collecting. However, using the techniques of this disclosure, two writes of 2 KiB may be commanded to the 4 KiB MLC page between erasure cycles, allowing the compressed data to fit in the reduced-capacity pages. In addition, because the SSD's overprovisioning may have been selected to support even non-compressible data, this mapping should not cause the SSD to run out of internal mappable capacity.

Another advantage of the techniques of the disclosure may be reducing the effects of non-linear data retention. Some non-volatile memory exhibit data retention issues at higher voltage levels. By storing "cold" data, e.g., data that is not likely to be replaced relatively soon, at lower voltage levels, and storing "hot" data, e.g., data that is likely to be replaced relatively soon, at higher voltage levels, techniques of this disclosure may reduce the effects of non-linear data retention.

Figure 6:
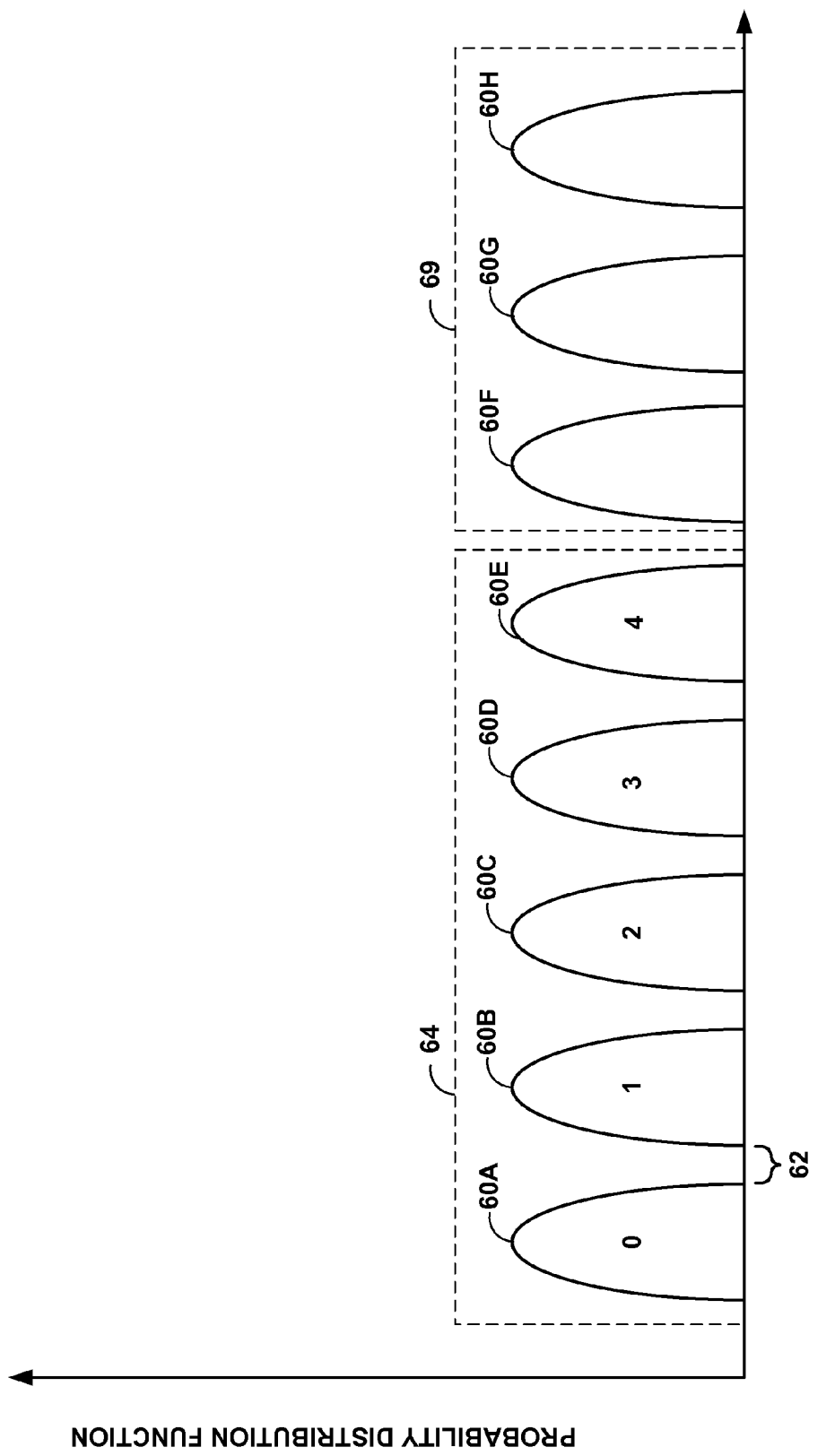
FIG. 6 is a graph illustrating another example of voltage levels in an MLC flash cell and the bits associated with each voltage level, in accordance with the techniques of this disclosure.

FIG. 6 is a graph illustrating another example of voltage levels in an MLC flash cell and the bits associated with each voltage level, in accordance with the techniques of this disclosure. In FIG. 6, a non-power-of-two example is depicted. Assume in FIG. 6 that the three voltage levels 60E-60H in second group 69 each cause enough wear to the cell that it would be desirable to avoid using any of levels 60E-60H. Thus, the five voltage levels, namely 60A-60E, in first group 65 are available for use. With these five voltage levels, the cell may store a base-5 symbol, e.g., "0," "1," "2," "3," or "4." Using a lesser number of voltage levels, e.g., base-5, than the number that fit in the standard MLC mapping may allow voltage gap 62 to be finely adjusted such that the signal-to-noise ratio may be more accurately controlled while avoiding particular high-voltage ranges. Note that although a base-5 example is depicted, other non-power-of-two examples may be used.

Figure 7:
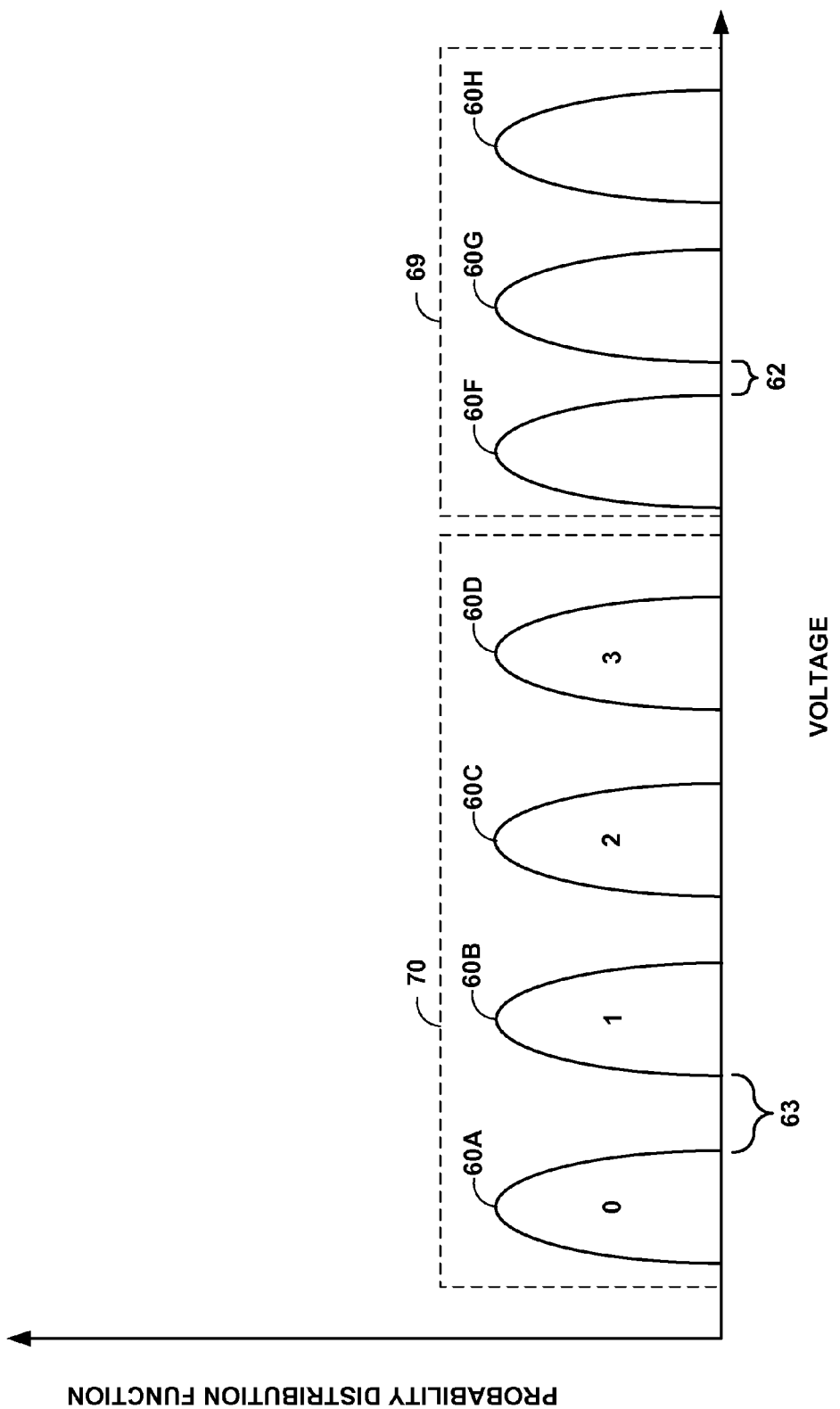
FIG. 7 is a graph illustrating another example of voltage levels in an MLC flash cell and the bits associated with each voltage level, in accordance with the techniques of this disclosure.

FIG. 7 is a graph illustrating another example of voltage levels in an MLC flash cell and the digits associated with each voltage level, in accordance with the techniques of this disclosure. Assume in FIG. 7 that the three voltage levels 60E-60H in second group 69 each cause enough wear to the cell that it would be desirable to avoid using any of levels 60E-60H. Thus, five voltage levels in first group 70 may be available for use. However, with sufficient overprovisioning, it may be desirable to use only four voltage levels, rather than the five voltage levels available. As depicted in FIG. 7, four voltage levels, namely 60A-60D, are spread into the five available voltage levels. Spreading the voltage levels 60A-60D further apart may increase the voltage gap between voltage levels, thereby reducing the chance that noise or voltage drift over time causes a symbol to be decoded incorrectly. For example original voltage gap 62 may be increased to voltage gap 63, thereby improving signal-noise-ratio characteristics. In this manner, the cell depicted in FIG. 7 may store a base-4 symbol, i.e., "0," "1," "2," or "3." It may also be desirable to spread three voltage levels across the available five voltage levels to further improve signal-to-noise ratio, for example.

Figure 8:
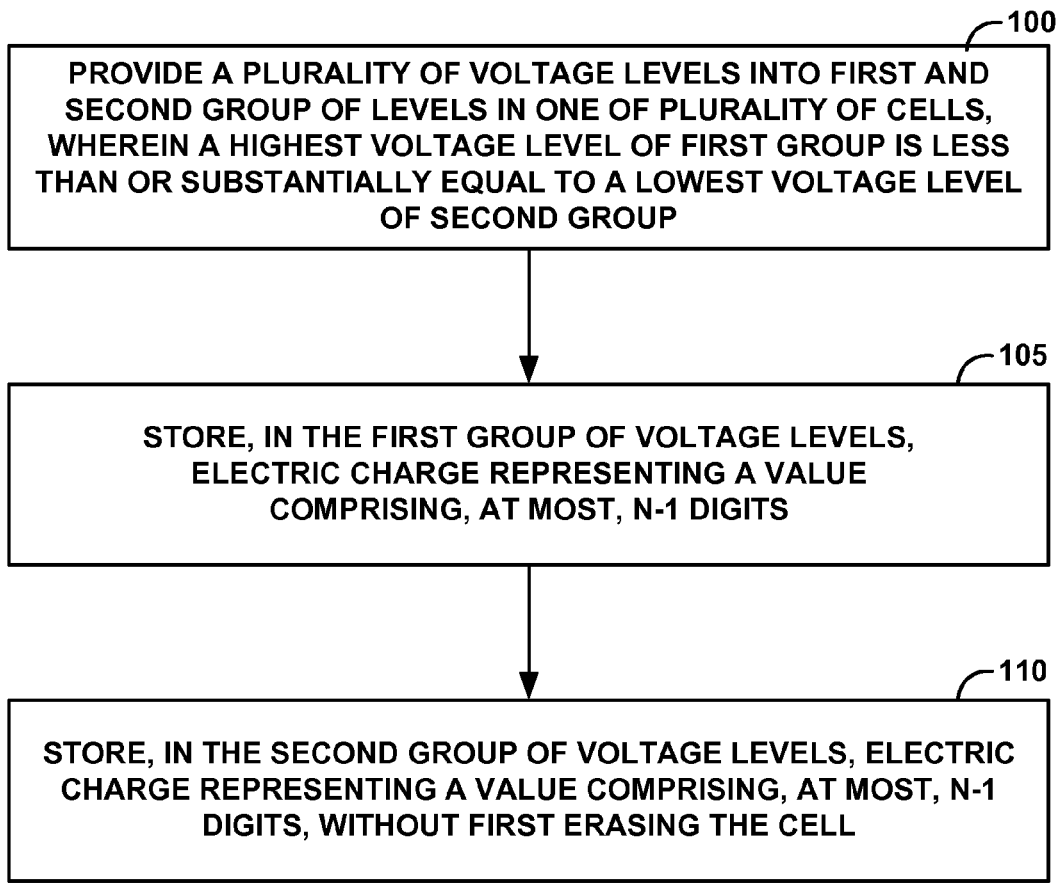
FIG. 8 is a flow chart illustrating an example method for programming a non-volatile memory, in accordance with this disclosure.

FIG. 8 is a flow chart illustrating an example method for programming a non-volatile memory, in accordance with this disclosure. The memory includes a plurality of cells, wherein each of the plurality of cells is configured to store a plurality of values. Each of the plurality of values is represented by N digits where N is an integer greater than 1. Each of the plurality of cells is further configured to store electric charge representing a plurality of voltage levels. Each of the plurality of voltage levels represents one of the plurality of values. As shown in FIG. 8, the programming comprises controller 12 executing instructions that provide the plurality of voltage levels into a first group of voltage levels and a second group of voltage levels in one of the plurality of cells, wherein a highest voltage level of the first group is less than or substantially equal to a lowest voltage level of the second group (100). Upon receiving data from host 40, controller 12 determines the particular cell to be written to and provides ADC/DAC 50 with appropriate word and bit lines that form the address of the cell. Controller 12 then instructs ADC/DAC 50 to assert a voltage onto the cell to be written to. In conjunction with on-chip charge pumps or an external supply, the assertion of a voltage onto the cell by ADC/DAC 50 forces charge from the channel onto the floating gate of the cell. In this manner, the cell stores, in the first group of voltage levels, electric charge representing a value comprising, at most, N-1 digits (105).

In some examples, the non-volatile memory is NAND flash. In other examples, the lowest voltage level of the second group is substantially equal to the highest voltage level of the first group.

In an optional step, the cell may be "reused," e.g., reprogrammed without first erasing the erasure block comprising the cell. To reuse the cell, controller 12 instructs ADC/DAC 50 to read the current voltage on the floating gate of the cell. ADC/DAC 50 returns a value to controller 12. In some examples, controller 12 queries a look-up table to determine the bit pattern associated with the particular voltage level returned by the ADC/DAC 50. Controller 12 instructs ADC/DAC 50 to assert a voltage onto the cell and, in conjunction with on-chip charge pumps, the assertion of a voltage onto the cell by ADC/DAC 50 forces charge from the channel onto the floating gate of the cell sufficient to change the voltage level from a voltage level in the first group to a voltage level in the second group. In this manner, the cell stores, in the second group of voltage levels, electric charge representing a value comprising, at most, N-1 digits, without first erasing the cell (110).

The techniques described above generally relate to partitioning the voltage levels in a cell of a non-volatile memory into multiple groups of voltage levels, e.g., two, such that a highest voltage level of the first group is less than or substantially equal to a lowest voltage level of the second group. Such partitioning may be used for reducing wear in a SSD.

In accordance with this disclosure, wear may also be reduced in a SSD by using more cells of the non-volatile memory with fewer voltage levels per cell available to store charge. Such an implementation may reduce wear by avoiding the highest voltage levels available in a cell during programming.

Figure 9:
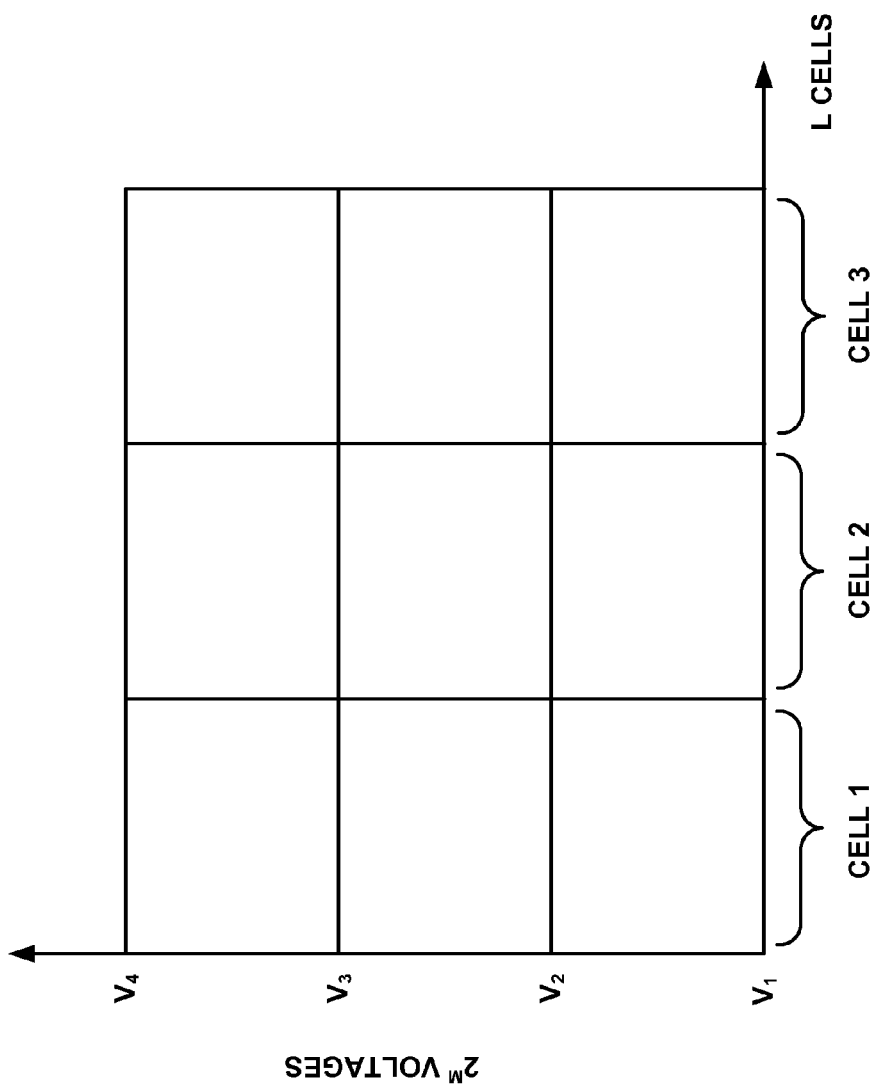
FIG. 9 is a schematic diagram illustrating a portion of a non-volatile memory configured to store electric charge representing $2^M$ voltage levels per cell.

FIG. 9 is a schematic diagram illustrating a portion of a non-volatile memory configured to store electric charge representing $2^M$ voltage levels per cell. The x-axis in FIG. 9 represents a first set of L cells in the non-volatile memory, e.g., SSD, where L is an integer. For ease of illustration and simplicity, three cells have been depicted, so L=3 in this particular example. Of course, it may be desirable for L to be larger than three. The y-axis in FIG. 9 represents voltage and, in particular, the $2^M$ voltage levels that are available per cell, where M is an integer. In FIG. 9, for ease of illustration and simplicity, four voltage levels have been depicted, namely $V_1$-$V_4$, so M=2 in this particular example. Voltage $V_1$ may be, for example, the voltage that represents an erased cell, and $V_4$ may be the maximum voltage available for programming.

Each of the $2^M$ voltage levels that are available per cell may represent one of $2^M$ values, with each value represented by M digits. For example, in FIG. 9, each cell may store one of four values represented by two digits, e.g., 00, 01, 10, and 11. The configuration shown in FIG. 9 may store $2^{LM}$ values, or $2^{3*2}=2^6=64$ values. The configuration may represent 64 values because each of the three cells depicted may store electric charge representing a voltage level that represents one of four values, namely 00, 01, 10, and 11, and with three cells in a row, there are 64 combinations of 00, 01, 10, and 11.

Figure 10:
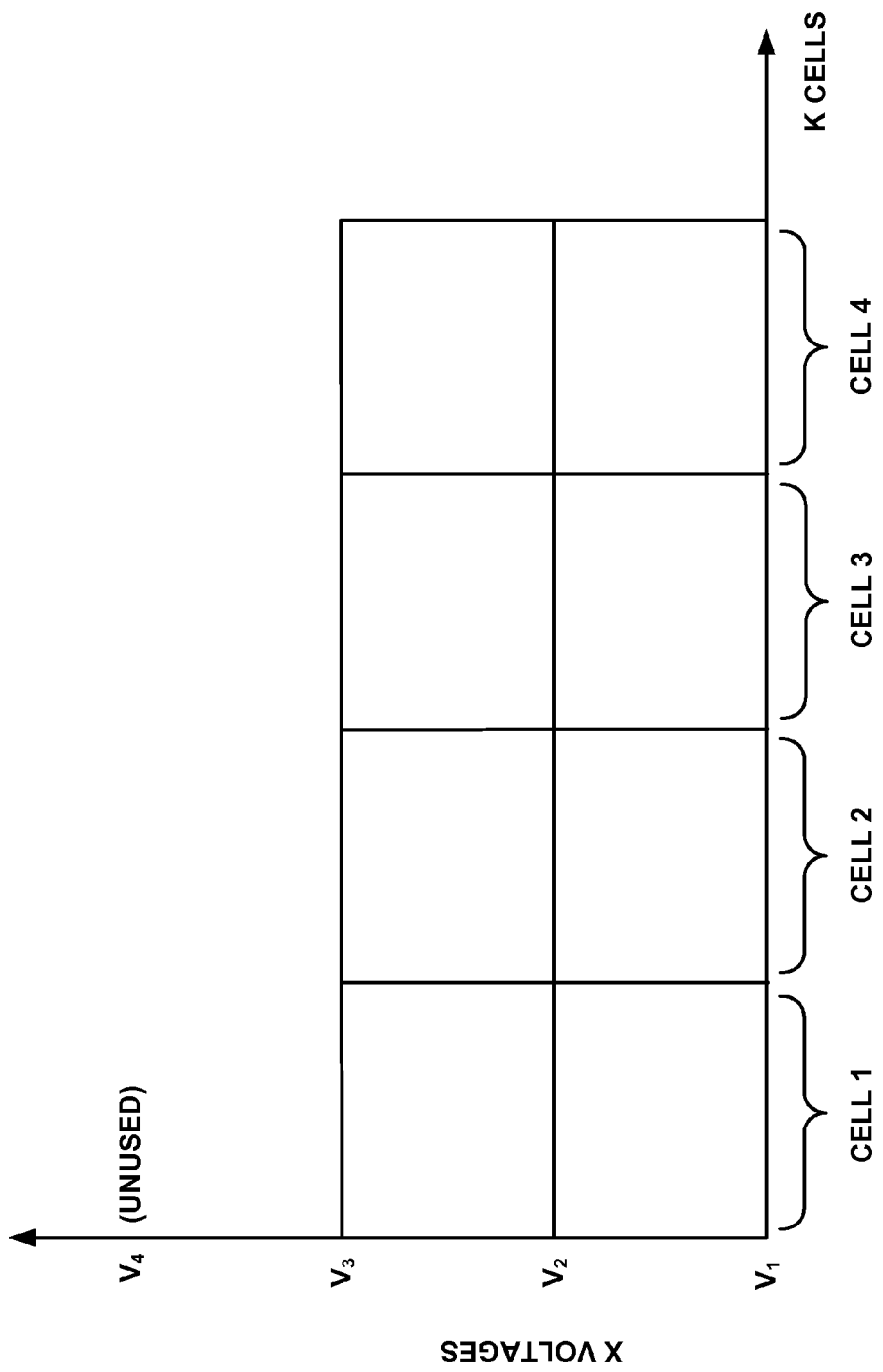
FIG. 10 is a schematic diagram illustrating a portion of non-volatile memory configured to store electric charge representing fewer voltage levels than the memory of FIG. 9, and in more cells than the memory of FIG. 9, in accordance with this disclosure.

FIG. 10 is a schematic diagram illustrating a portion of non-volatile memory configured to store electric charge representing fewer voltage levels than the memory of FIG. 9, and in more cells than the memory of FIG. 9, in accordance with this disclosure. In this manner, wear may be reduced in a SSD by avoiding using the highest voltage level available for programming. The x-axis in FIG. 10 represents a second set of K cells in the non-volatile memory, e.g., SSD, where K is an integer and greater than L. For ease of illustration and simplicity, four cells have been depicted, so K=4 in this particular example. Of course, it may be desirable for K to be larger than four. The y-axis in FIG. 10 represents voltage and, in particular, the X voltage levels that are available per cell in the second set of K cells. In FIG. 10, for ease of illustration and simplicity, four voltage levels have been depicted, namely $V_1$-$V_4$. As seen in FIG. 10, only voltages $V_1$-$V_3$ are available for programming. The highest voltage $V_4$ is unused. As such, X=3 in this particular example. In some examples, $X=2^P$, where P is an integer or non-integer, and where P represents the digits that may be stored in each of the X voltage levels.

In order to provide adequate storage, the configuration in FIG. 10 must be able to store at least the 64 values that could have been stored using the configuration in FIG. 9. That is, the K cells in FIG. 10 with X=3 voltage levels per cell must be able to store enough information to provide an alternative storage means for the data that could have been stored in the L cells with $2^M$ voltage levels per cell. The configuration depicted in FIG. 10, may represent $X^K$, or $3^4$=81 values. Because the number of values, i.e., 81, using the configuration in FIG. 10, is equal to or greater than the number of values using the configuration in FIG. 9, i.e., 64, the configuration in FIG. 10 provides adequate storage.

The number of K cells for storage may be determined by either of the following equivalent equations:

$$K \geq (L*M)/\log_2(X) \quad (1), \text{ or}$$

$$K \geq (L*M)/N \quad (2)$$

By way of specific example, assume that it is desirable to use only three voltage levels per cell to avoid using the fourth, and highest, voltage level. Thus, X=3. Using equation (1) above, the number of K cells required to store the data that could have been stored in, for example, the specific configuration shown in FIG. 9, must be equal to or greater than $(L*M)/\log_2(X)$, or $(3*2)/\log_2 3$=3.7856 (rounded). The number of K cells must be an integer and greater than or equal to 3.7856, so K=4 is the least number of cells needed to store the same amount of data as the configuration depicted in FIG. 9. In this manner, the data to be stored may be spread out among more cells, but because lower voltage levels are used per cell, there may be less overall wear.

In accordance with this disclosure, wear may also be reduced in a SSD by using fewer cells of the non-volatile memory with more voltage levels per cell available to store charge. Such an implementation may reduce wear by reducing the number of cells to be erased.

Figure 11:
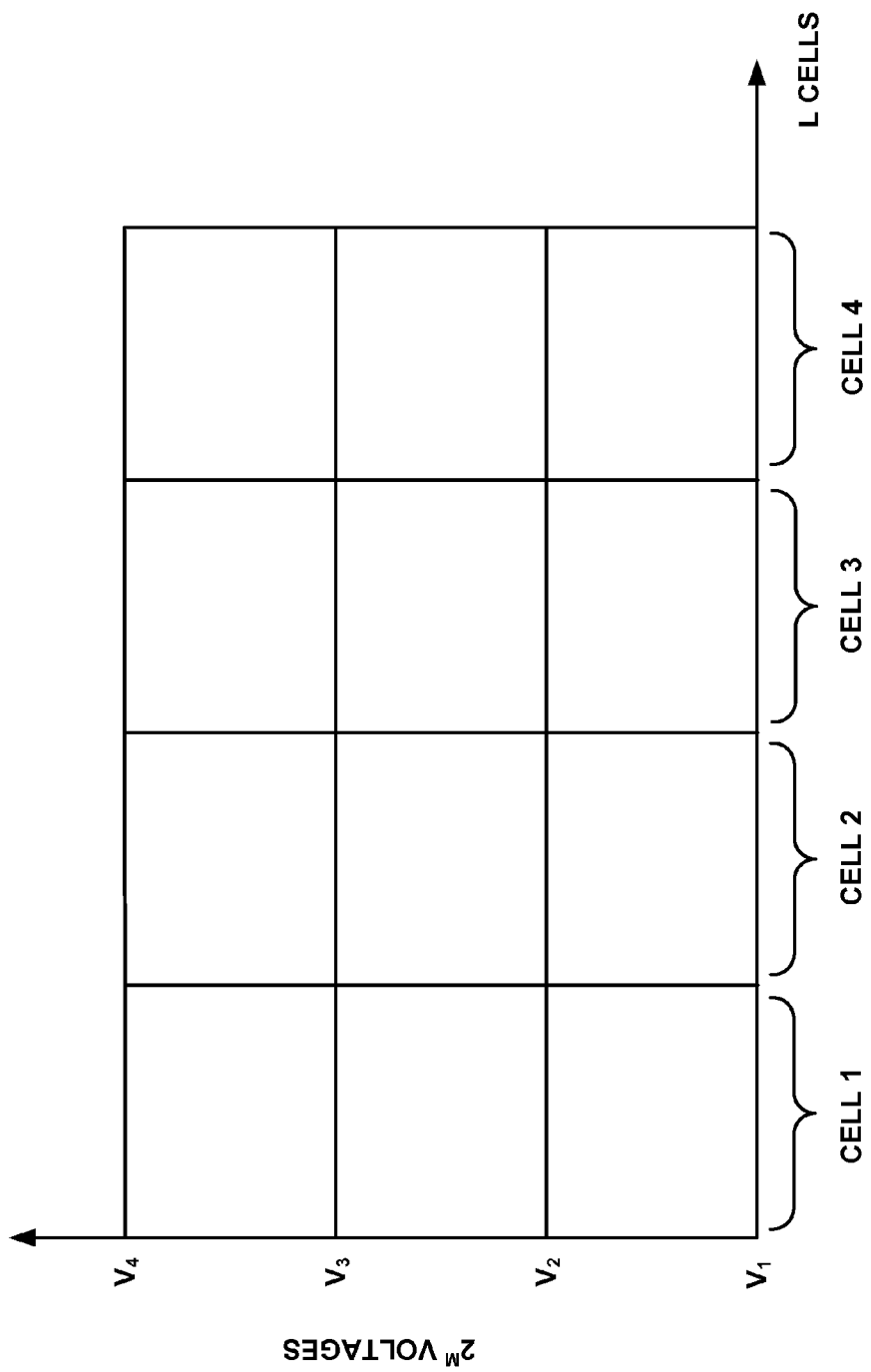
FIG. 11 is a schematic diagram illustrating a portion of a non-volatile memory configured to store electric charge representing $2^M$ voltage levels per cell.

FIG. 11 is a schematic diagram illustrating a portion of a non-volatile memory configured to store electric charge representing $2^M$ voltage levels per cell. The x-axis in FIG. 11 represents a first set of L cells in the non-volatile memory, e.g., SSD, where L is an integer. For ease of illustration and simplicity, four cells have been depicted, so L=4 in this particular example. Of course, it may be desirable for L to be larger than four. The y-axis in FIG. 11 represents voltage and, in particular, the $2^M$ voltage levels that are available per cell, where M is an integer. In FIG. 11, for ease of illustration and simplicity, four voltage levels have been depicted, namely $V_1$-$V_4$, so M=2 in this particular example. Voltage $V_1$ may be, for example, the voltage that represents an erased cell, and $V_4$ may be the maximum voltage available for programming.

Each of the $2^M$ voltage levels that are available per cell may represent one of $2^M$ values, with each value represented by M digits. For example, in FIG. 11, each cell may store one of four values represented by two digits, e.g., 00, 01, 10, and 11. The configuration shown in FIG. 11 may represent $2^{LM}$ values, or $2^{4*2}=2^8$=256 values. The configuration may represent 256 values because each of the four cells depicted may store electric charge representing a voltage level that represents one of four values, namely 00, 01, 10, and 11, and with four cells in a row, there are 256 combinations of 00, 01, 10, and 11.

Figure 12:
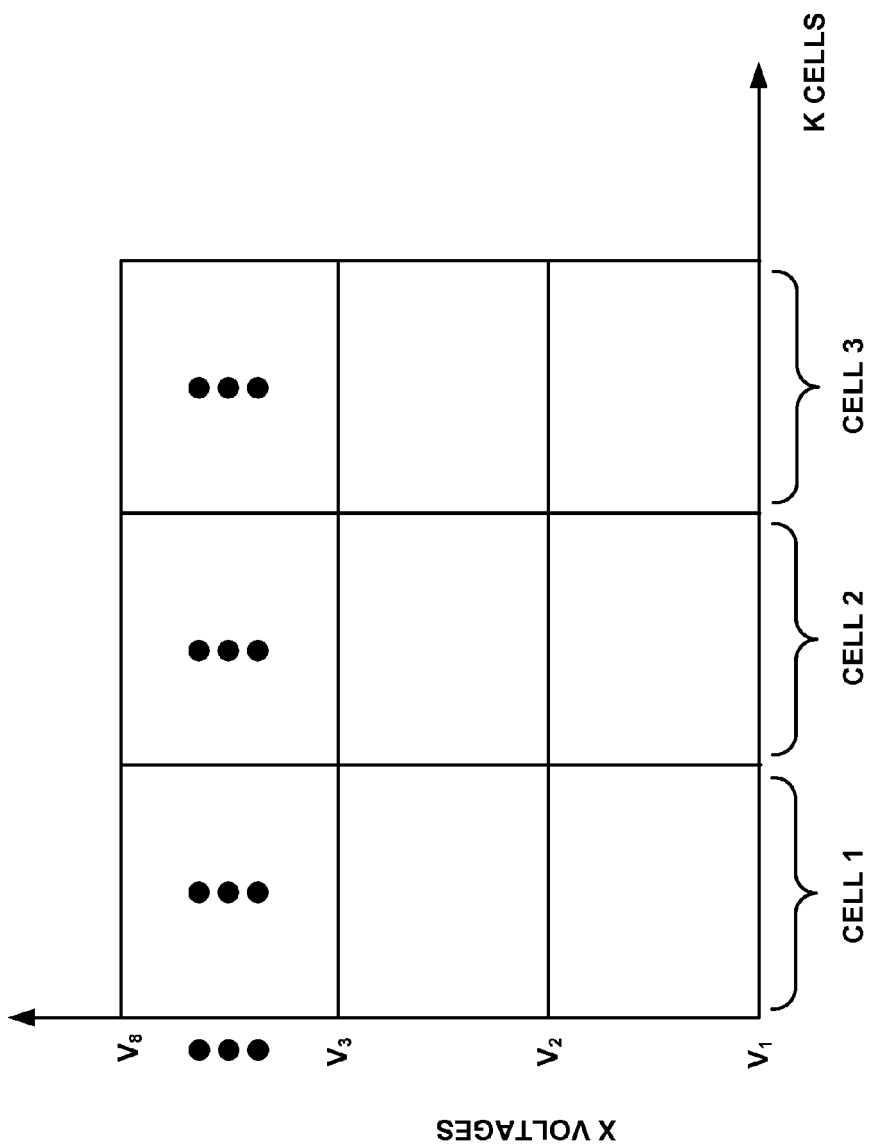
FIG. 12 is a schematic diagram illustrating a portion of non-volatile memory configured to store electric charge representing more voltage levels than the memory of FIG. 11, in fewer cells than the memory of FIG. 11, in accordance with this disclosure.

FIG. 12 is a schematic diagram illustrating a portion of non-volatile memory configured to store electric charge representing more voltage levels than the memory of FIG. 11, in fewer cells than the memory of FIG. 11, in accordance with this disclosure. In this manner, wear may be reduced in a SSD by reducing the number of cells to be erased, and thus the amount of wear that may be caused by erasure. The x-axis in FIG. 12 represents a second set of K cells in the non-volatile memory, e.g., SSD, where K is an integer and less than L. For ease of illustration and simplicity, three cells have been depicted, so K=3 in this particular example. Of course, it may be desirable for K to be larger than three. The y-axis in FIG. 12 represents voltage and, in particular, the X voltage levels that are available per cell in the second set of K cells. In FIG. 12, for ease of illustration and simplicity, eight voltage levels have been depicted, namely $V_1$-$V_8$. As seen in FIG. 12, all voltages $V_1$-$V_8$ are available for programming. As such, X=8 in this particular example. In some examples, $X=2^P$, where P is an integer or non-integer, and where P represents the digits that may be stored in each of the X voltage levels. In this particular example, since P=3.

In order to provide adequate storage, the configuration in FIG. 12 must be able to store at least the 256 values that could be represented using the configuration in FIG. 11. That is, the K cells in FIG. 12 with X=8 voltage levels per cell must be able to store enough information to provide an alternative storage means for the data that could have been stored in the L cells with $2^M$ voltage levels per cell. The configuration depicted in FIG. 12, may represent $X^K$, or $8^3$=512 values. Because the number of values, i.e., 512, using the configuration in FIG. 12, is equal to or greater than the number of values using the configuration in FIG. 11, i.e., 256, the configuration in FIG. 12 provides adequate storage. The number of K cells for storage may be determined by using either of the equations (1) or (2) presented above.

By way of specific example, assume that it is desirable to use fewer than four cells to reduce the wear that may be caused by erasure. In addition, assume that it is desirable to store the charge representing the data in eight voltage levels, rather than the four voltage levels shown in FIG. 11. As such, X=8. Using equation (1) above, the number of K cells required to store the data that could have been stored in, for example, the specific configuration shown in FIG. 11, must be equal to or greater than $(L*M)/\log_2(X)$, or $(4*2)/\log_2 8$=2.667 (rounded). The number of K cells must be an integer and greater than or equal to 2.667, so K=3 is the least number of cells needed to store the same amount of data as the configuration depicted in FIG. 11. In this manner, the data to be stored may be compacted into fewer cells, thereby requiring fewer cells to be erased.

It should be noted that in some examples, the number of X voltage levels may be re-examined after the number of K cells is determined. In the example above, the number of K cells was determined to be three, based on X=8 voltage levels. However, it may be possible to reduce the number of voltage levels, thereby allowing use of a subset of voltages to potentially reduce wear in cases where a maximum voltage may be linked to increased wear. Additionally, reducing the number of voltage levels may allow the voltage levels to be spaced further apart from one another, as discussed above, thereby improving SNR. The value of X may be re-examined by solving equation (1) above for X. Continuing the example above, if K=3, L=4, M=3, then X must be an integer greater than or equal to 6.34 (rounded), or 7. Thus, seven voltage levels in three cells would be sufficient to store the values that could have been stored in the configuration of FIG. 11.

Figure 13:
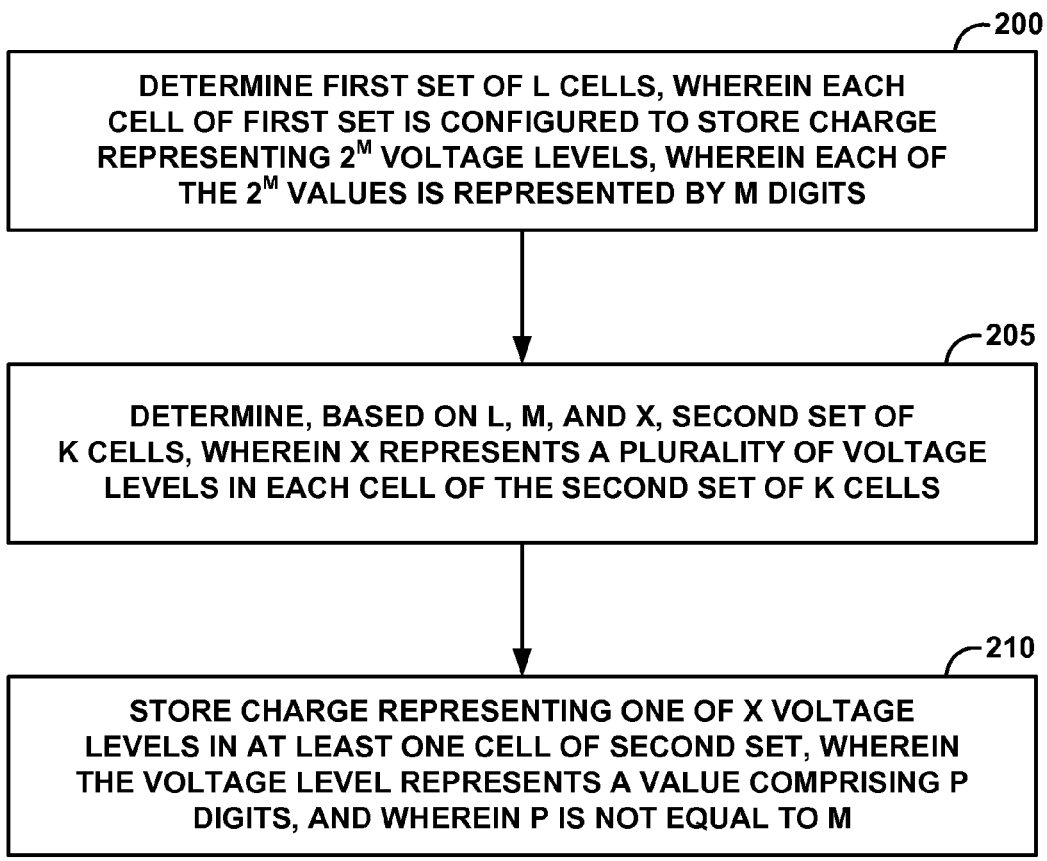
FIG. 13 is a flow chart illustrating an example method for programming a non-volatile memory, in accordance with this disclosure

FIG. 13 is a flow chart illustrating an example method for programming a non-volatile memory, in accordance with this disclosure. The non-volatile memory includes a plurality of cells. As shown in FIG. 13, the programming comprises controller 12 executing instructions that determine a first set of L cells of the plurality of cells, wherein each cell of the first set is configured to store electric charge representing $2^M$ voltage levels, wherein L and M are integers, wherein each of the plurality of voltage levels represents one of $2^M$ values, and wherein each of the $2^M$ values is represented by M digits (200). In this manner, controller 12 may determine the number of values that can be stored in L cells that each may store one of $2^M$ values.

Controller 12 may then determine, based on L, M, and X, a second set of K cells of the plurality of cells, wherein K and X are integers and wherein K is not equal to L, wherein X represents a plurality of voltage levels in each cell of the second set of K cells (205). In some example implementations, K is greater than L, X is less than $2^M$ and equal to $2^P$, and P is less than M. Such an implementation may be useful in that it reduces the number of voltage levels required by increasing the number of cells used. In other example implementations, K is less than L, X is greater than $2^M$ and equal to $2^P$, and P is greater than M. Such an implementation may be useful in that it decreases the number of cells used, thereby reducing the amount of wear that may result from erasure operations.

Upon receiving data from host 40, controller 12 determines the particular cells of the second set of K cells to be written to and provides ADC/DAC 50 with appropriate word and bit lines that form the address of those cells. Controller 12 then instructs ADC/DAC 50 to assert a voltage onto a cell to be written to. In conjunction with on-chip charge pumps or an external supply, the assertion of a voltage onto a cell by ADC/DAC 50 forces charge from the channel onto the floating gate of the cell. In this manner, the cell stores electric charge representing one of the X voltage levels in at least one cell of the second set of K cells, wherein the one of the X voltage levels represents a value comprising P digits, and wherein P is an integer or non-integer and not equal to M (210). In some example implementations, the one of the X voltage levels represents a value comprising, at most, P digits.

The techniques described in this disclosure may be implemented, at least in part, in hardware, software, firmware or any combination thereof. For example, various aspects of the described techniques may be implemented within one or more controllers, one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "controller," "processor," or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

The techniques described in this disclosure may also be embodied or encoded in a computer-readable medium, such as a computer-readable storage medium, containing instructions. Instructions embedded or encoded in a computer-readable medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

The implementations described above and other implementations are within the scope of the following claims.

The invention claimed is:

1. A method comprising:
    programming a non-volatile memory, wherein the memory includes a plurality of cells, wherein each of the plurality of cells is configured to store a plurality of values, wherein each of the plurality of values is represented by N digits where N is an integer greater than 1, wherein each of the plurality of cells is further configured to store electric charge representing a plurality of voltage levels, wherein each of the plurality of voltage levels represents one of the plurality of values, wherein programming comprises:
        providing the plurality of voltage levels into a first group of voltage levels and a second group of voltage levels in one of the plurality of cells, wherein a highest voltage level of the first group is less than or substantially equal to a lowest voltage level of the second group; and
        storing, in the first group of voltage levels, electric charge representing a value comprising, at most, N-1 digits.

2. The method of claim 1, further comprising:
    storing, in the second group of voltage levels, electric charge representing a value comprising, at most, N-1 digits, without first erasing the cell.

3. The method of claim 1, wherein the lowest voltage level of the second group is substantially equal to the highest voltage level of the first group.

4. The method of claim 1, wherein the non-volatile memory is NAND flash.

5. A system comprising:
a non-volatile memory, wherein the memory includes a plurality of cells, wherein each of the plurality of cells is configured to a plurality of values, wherein each of the plurality of values is represented by N digits where N is an integer greater than 1, wherein each of the plurality of cells is further configured to store electric charge representing a plurality of voltage levels, wherein each of the plurality of voltage levels represents one of the plurality of values; and at least one controller configured to:
provide the plurality of voltage levels into a first group of voltage levels and a second group of voltage levels in one of the plurality of cells, wherein a highest voltage level of the first group is less than or substantially equal to a lowest voltage level of the second group; and store, in the first group of voltage levels, electric charge representing a value comprising, at most, N-1 digits.

6. The system of claim 5, wherein the at least one controller is further configured to:
store, in the second group of voltage levels, electric charge representing a binary value comprising, at most, N-1 digits, without first erasing the cell.

7. The system of claim 5, wherein the lowest voltage level of the second group is substantially equal to the highest voltage level of the first group.

8. The system of claim 5, wherein the non-volatile memory is NAND flash.

9. A computer-readable medium comprising instructions encoded on the computer-readable medium that, upon execution, cause a controller within a device to:
program a non-volatile memory, wherein the memory includes a plurality of cells, wherein each of the plurality of cells is configured to store a plurality of values, wherein each of the plurality of values is represented by N digits where N is an integer greater than 1, wherein each of the plurality of cells is further configured to store electric charge representing a plurality of voltage levels, wherein programming the non-volatile memory comprises:
providing the plurality of voltage levels into a first group of voltage levels and a second group of voltage levels in one of the plurality of cells, wherein a highest voltage level of the first group is less than or substantially equal to a lowest voltage level of the second group; and storing, in the first group of voltage levels, electric charge representing a value comprising, at most, N-1 digits.

10. The computer-readable medium of claim 9, further comprising instructions encoded on the computer-readable medium that, upon execution, cause the controller to:
store, in the second group of voltage levels, electric charge representing a binary value comprising, at most, N-1 digits, without first erasing the cell.

11. The computer-readable medium of claim 9, wherein the lowest voltage level of the second group is substantially equal to the highest voltage level of the first group.

12. The computer-readable medium of claim 9, wherein the non-volatile memory is NAND flash.

13. A method of programming a non-volatile memory comprising a plurality of cells, the method comprising:
determining a first set of L cells of the plurality of cells, wherein each cell of the first set is configured to store electric charge representing $2^M$ voltage levels, wherein L and M are integers, wherein each of the plurality of voltage levels represents one of $2^M$ values, and wherein each of the $2^M$ values is represented by M digits;

determining, based on L, M, and X, a second set of K cells of the plurality of cells, wherein K and X are integers and wherein K is not equal to L, wherein X represents a plurality of voltage levels in each cell of the second set of K cells; and storing electric charge representing one of the X voltage levels in at least one cell of the second set of K cells, wherein the one of the X voltage levels represents a value comprising P digits, and wherein P is an integer or non-integer and not equal to M.

14. The method of claim 13, wherein K is greater than L, wherein X is less than $2^M$ and equal to $2^P$, and wherein P is less than M.

15. The method of claim 13, wherein K is less than L, wherein X is greater than $2^M$ and equal to $2^P$, and wherein P is greater than M.

16. The method of claim 13, wherein the value of K is determined by an equation such that $K \geq (L*M)/\log_2(X)$.

17. The method of claim 13, wherein the non-volatile memory is NAND flash.

18. The method of claim 13, wherein the one of the X voltage levels represents a value comprising, at most, P digits.

19. A system comprising:
a non-volatile memory comprising a plurality of cells; and
at least one controller configured to:
determine a first set of L cells of the plurality of cells, wherein each cell of the first set is configured to store electric charge representing $2^M$ voltage levels, wherein L and M are integers, wherein each of the plurality of voltage levels represents one of $2^M$ values, and wherein each of the $2^M$ values is represented by M digits;

determine, based on L, M, and X, a second set of K cells of the plurality of cells, wherein K and X are integers and wherein K is not equal to L, wherein X represents a plurality of voltage levels in each cell of the second set of K cells; and store electric charge representing one of the X voltage levels in at least one cell of the second set of K cells, wherein the one of the X voltage levels represents a value comprising P digits, wherein P is an integer or non-integer and not equal to M.

20. The system of claim 19, wherein K is greater than L, wherein X is less than $2^M$ and equal to $2^P$, and wherein P is less than M.

21. The system of claim 19, wherein K is less than L, wherein X is greater than $2^M$ and equal to $2^P$, and wherein P is greater than M.

22. The system of claim 19, wherein the value of K is determined by an equation such that $K \geq (L*M)/\log_2(X)$.

23. The system of claim 19, wherein the non-volatile memory is NAND flash.

24. The system of claim 19, wherein the one of the X voltage levels represents a value comprising, at most, P digits.

25. A computer-readable medium comprising instructions encoded on the computer-readable medium that, upon execution, cause a controller within a device to:
determine a first set of L cells of a plurality of cells of a non-volatile memory, wherein each cell of the first set is configured to store electric charge representing $2^M$ voltage levels, wherein L and M are integers, wherein each of the plurality of voltage levels represents one of $2^M$ values, and wherein each of the $2^M$ values is represented by M digits;

determine, based on L, M, and X, a second set of K cells of the plurality of cells, wherein K and X are integers and wherein K is not equal to L, wherein X represents a plurality of voltage levels in each cell of the second set of K cells; and store electric charge representing one of the X voltage levels in at least one cell of the second set of K cells, wherein the one of the X voltage levels represents a value comprising P digits, and wherein P is an integer or non-integer and not equal to M.

26. The computer-readable medium of claim 25, wherein K is greater than L, wherein X is less than $2^M$ and equal to $2^P$, and wherein P is less than M.

27. The computer-readable medium of claim 25, wherein K is less than L, wherein X is greater than $2^M$ and equal to $2^P$, and wherein P is greater than M.

28. The computer-readable medium of claim 25, wherein the value of K is determined by an equation such that $K \geq (L*M)/\log_2(X)$.

29. The computer-readable medium of claim 25, wherein the non-volatile memory is NAND flash.

30. The computer-readable medium of claim 25, wherein the one of the X voltage levels represents a value comprising, at most, P digits.

* * * * *